(12) United States Patent
Zettner et al.

(10) Patent No.: US 9,696,381 B2
(45) Date of Patent: Jul. 4, 2017

(54) METHOD FOR TESTING A BAR WINDING OF A ROTOR OF A ROTATING ELECTRICAL MACHINE

(71) Applicant: SIEMENS AKTIENGESELLSCHAFT, München (DE)

(72) Inventors: Jürgen Zettner, Veitsbronn (DE); Christian Deeg, Altdorf (DE); Thomas Schuhmann, Chemnitz (DE)

(73) Assignee: Siemens Aktiengesellschaft, München (DE)

( * ) Notice: Subject to any disclaimer, the term of this patent is extended or adjusted under 35 U.S.C. 154(b) by 69 days.

(21) Appl. No.: 14/778,407

(22) PCT Filed: Feb. 19, 2014

(86) PCT No.: PCT/EP2014/053191
§ 371 (c)(1),
(2) Date: Sep. 18, 2015

(87) PCT Pub. No.: WO2014/146847
PCT Pub. Date: Sep. 25, 2014

(65) Prior Publication Data
US 2016/0274192 A1    Sep. 22, 2016

(30) Foreign Application Priority Data
Mar. 19, 2013 (EP) .................................... 13159840

(51) Int. Cl.
*G01R 31/34* (2006.01)
*G01K 13/08* (2006.01)
(Continued)

(52) U.S. Cl.
CPC .......... *G01R 31/346* (2013.01); *G01K 13/08* (2013.01); *G01R 31/343* (2013.01); *H02K 11/25* (2016.01); *H02K 15/00* (2013.01); *H02K 17/16* (2013.01)

(58) Field of Classification Search
USPC .................. 324/545–547, 765.01, 756.02
See application file for complete search history.

(56) References Cited

U.S. PATENT DOCUMENTS 3,875,511 A * 4/1975 Sims ...................... G01R 31/34
                                                  324/545
4,114,077 A    9/1978 Oates et al.
(Continued)

FOREIGN PATENT DOCUMENTS

DE         1945343 A1    3/1971
DE     102009034830 A1    2/2011
(Continued)

OTHER PUBLICATIONS

Sun Baoyuan et al; "Sensors and their application handbook"; 2004.

*Primary Examiner* — Vincent Q Nguyen
(74) *Attorney, Agent, or Firm* — Henry M. Feiereisen, LLC

(57) ABSTRACT

In a method for testing a bar winding of a rotor of a rotating electrical machine, a rotor temperature is detected by a thermal radiation sensor, which is arranged in a stator of the rotating electrical machine. A thermal radiation sensor is used with a resolution suitable for the thermal detection of individual bars of the bar winding. The rotor is rotated at a speed that is lower than a limit frequency of the thermal radiation sensor divided by the number of bars of the bar winding, and the thermal radiation of the rotor is detected by the thermal radiation sensor. The thermal radiation sensor is sampled at a sampling frequency that is higher than the (Continued)

speed of the rotor multiplied by the number of bars and the sampled values of the thermal radiation sensor are evaluated.

14 Claims, 6 Drawing Sheets

(51) Int. Cl.
    *H02K 15/00*           (2006.01)
    *H02K 11/25*           (2016.01)
    *H02K 17/16*           (2006.01)

(56) References Cited

U.S. PATENT DOCUMENTS

| | | |
|---|---|---|
| 4,914,386 A * | 4/1990 | Zocholl ................ G01R 31/343 174/DIG. 16 |
| 8,283,817 B2 | 10/2012 | Deeg et al. |
| 8,358,094 B2 | 1/2013 | Zettner |
| 2008/0067963 A1 | 3/2008 | Pronovost et al. |
| 2013/0264472 A1 | 10/2013 | Schimmer et al. |

FOREIGN PATENT DOCUMENTS

| | | |
|---|---|---|
| RU | 2386114 C1 | 4/2010 |
| SU | 1013876 A1 | 4/1983 |
| WO | WO 2009155954 A1 | 12/2009 |
| WO | WO 2011020500 A1 | 2/2011 |

* cited by examiner

METHOD FOR TESTING A BAR WINDING OF A ROTOR OF A ROTATING ELECTRICAL MACHINE

CROSS-REFERENCES TO RELATED APPLICATIONS

This application is the U.S. National Stage of International Application No. PCT/EP2014/053191, filed Feb. 19, 2014, which designated the United States and has been published as International Publication No. WO 2014/146847 and which claims the priority of European Patent Application, Serial No. 13159840.1, filed Mar. 19, 2013, pursuant to 35 U.S.C. 119(a)-(d).

BACKGROUND OF THE INVENTION

The present invention relates to a method for testing a bar winding of a rotor of a rotating or linearly moved electrical machine, wherein thermal radiation of the rotor is detected by means of a thermal radiation sensor arranged in a stator or the rotating electrical machine. The invention also relates to a device for testing a bar winding of a rotor of a rotating electrical machine, having a thermal radiation sensor, arranged in a stator of the rotating electrical machine, by means of which thermal radiation of the rotor can be detected.

An electrical machine is a device which converts electrical energy into mechanical energy, in particular kinetic energy (motor operation) and/or mechanical energy into electrical energy (generator operation). A rotating electrical machine is an electrical machine in which a stator provides a, usually, circular opening in which a rotor is arranged so as to be rotatable. The stator is non-rotatably arranged with respect to the rotor. The stator and rotor are linked by means of a magnetic flux, whereby a force effect is generated in motor operation which drives the rotor so as to rotate with respect to the stator, and mechanical energy supplied to the rotor in generator operation is converted into electrical energy. For this purpose the stator and rotor each have a winding through which a current flows. The winding can also be formed or supplemented by a permanent magnet in the stator or rotor.

Rotating electrical machines of the generic type are known from the prior art, so separate documentary evidence is not necessary. Rotating electrical machines of the generic type are by way of example polyphase machines which are connected to a multi-phase, in particular three-phase electrical grid, such as asynchronous machines, synchronous machines with damper cage or the like. The bar winding can in particular be a cage winding, as is formed by way of example by a cage made from bars and shirt-circuit rings for example in the case of a cage rotor of an asynchronous machine. The bar winding preferably comprises conductor bars which extend substantially in an axial direction of the rotor and are electroconductively connected to the rotor-side ends, by way of example by short-circuit rings or end connectors.

The rotors of generic electrical machines are heavily stressed thermomechanically in non-stationary operating conditions. Operating conditions of this kind can be by way of example due to machine start-ups under overcurrent conditions through to attaining the nominal point, blocking of the electrical machine during operation and the like. High currents and power losses in the rotor bars and short-circuit ring can occur in the process. If the electrical machine is then switched off, the dissipated heat is retained in the rotor since the cooling effect of the switched-off machine usually does not exist. This situation occurs in particular with self-cooling in which the rotor simultaneously also drives a cooling system. The thermal energy of the rotor in particular can only be dissipated very inadequately due to the machine construction if no further cooling effect is provided. The rotor can heat up considerably after the electrical machine has been switched off in particular in the case of repeated loads, intermittent operation or the like, with the exact level of heating usually not being known. This can lead to a thermal overloading in particular in the case of renewed start-up of the electrical machine.

The heat is produced in the electrical machine during operation thereof substantially by the following sources of losses: current heat losses, magnetic reversal losses and friction losses. The heat generated by the sources of losses leads to thermal stress on the electrical machine. This stress manifests itself in particular in cyclical expansion and contraction of the machine parts, in particular of the rotor. The current heat losses affect the rotor bars in particular, which expand thermally precisely in the longitudinal direction. Connection points of the rotor bars, by way of example with a short-circuit ring, are mechanically loaded thereby. As a rule, connection points of this kind are formed by soldering, welding or casting. The alternating stress leads to ageing phenomena at the connection points which manifest themselves by way of example in increased electrical resistance in the region of the connection point. The ageing can lead to breaking of the connection point, whereby the electrical machine is ultimately unusable.

Different electrical bar resistances and transition resistances at the connection points also lead to imbalances in the current distribution in the rotor, whereby local temperature differences can occur at the surface of the rotor and moment swings may even be generated.

SUMMARY OF THE INVENTION

The object of the invention is to achieve an improvement in relation to the problems mentioned above.

As a solution, the invention proposes that in a generic testing method the thermal radiation of individual bars of the bar winding is detected by means of the thermal radiation sensor, wherein the method also comprises:
- rotating the rotor at a speed that is lower than a predefined limit frequency of the thermal radiation sensor divided by the number of bars of the bar winding,
- detecting the thermal radiation of the rotor by means of the thermal radiation sensor,
- sampling the thermal radiation sensor at a sampling frequency that is higher than the rotational speed of the rotor multiplied by the number of bars,
- evaluating the sampled values of the thermal radiation sensor.

Firstly, with the invention it is possible to detect detailed information about the thermomechanical stress of the rotor, in particular at the discrete contact points between bar and short-circuit ring. Operation of the electrical machine can be optimized hereby, so local overloading of the rotor can be avoided. Furthermore, the invention allows incipient damaged areas on the rotor to be recognized in good time so that countermeasures can be initiated. Findings may also be used for the modeling of electrical machines and for construction, moreover. In particular the invention proposes using a thermal radiation sensor which provides suitable spatial resolution and also suitable temporal resolution in order to enable the desired resolution for detecting individual bars of the rotor.

The thermal radiation sensor, which is arranged in the stator of the rotating electrical machine, can be arranged by way of example on the inside of the stator so as to face the rotor. The thermal radiation sensor can therefore be spaced from the rotor solely by way of the air gap, so the thermal radiation sensor achieves a spatial resolution which allows individual bars of the bar winding to be thermally detected. For this purpose the thermal radiation sensor is sensitive in the range of thermal radiation, in particular infrared radiation. The detected region if the thermal radiation sensor can comprise by way of example 0.01 cm$^2$ to 10 cm$^2$ but it can be chosen so as to be adapted to bar dimensions, in particular bar diameters, so reliable ascertainment of the bar temperature can be achieved.

The invention thereby enables, in particular also during normal operation, the condition of the rotor and its components, in particular the bars and optionally the short-circuit ring, to be detected. Unlike customary practice in the prior art, exact local loads on the electrical machine can therefore be ascertained, even during continuous operation, intermittent short-time operation, intermittent operation and the like. The thermal radiation sensor itself can be secured by way of example in a stator slot, on the stator core or the stator housing. There is also the possibility of providing suitable receivers, recesses, holes or the like on the stator side in which the thermal radiation sensor can be arranged. Optical diffraction means can also be provided in order to focus thermal radiation to be detected on the thermal radiation sensor. Diffraction means of this kind may be by way of example lenses, prisms, combinations thereof or the like.

A suitable resolution of the thermal radiation sensor is given if it is capable of detecting the thermal radiation of an individual bar of the bar winding. For this purpose said diffraction means can be provided for the thermal radiation.

To be able to detect local radiation values in the circumferential direction of the rotor the invention provides that the rotor is rotated. The rotational speed, at which the rotor is rotated, is less than a limit frequency of the thermal radiation sensor divided by the number of bars of the bar winding. The limit frequency of the thermal radiation sensor determines the temporal resolution with which the thermal radiation sensor can detect changes with regard to the thermal radiation. The limit frequency therefore determines a reaction speed of the thermal radiation sensor in relation to changes in thermal radiation which act on it. Since the thermal radiation of the rotor is to be detected in relation to bars, according to the invention the rotor should only be rotated as fast as the thermal radiation sensor can also detect the individual rotor bars of the bar winding during the revolution of the rotor. The thermal radiation sensor should therefore have a limit frequency which allows the number of bars to be detected during one rotor revolution. If, by way of example, the limit frequency of the thermal radiation sensor is 75 Hz and the rotor has ten rotor bars distributed over the circumference, the rotor should then be rotated at a rotational speed of <7.5 revolutions per second, so the individual bars can still be detected by the thermal radiation sensor.

The thermal radiation sensor converts the detected thermal radiation into an electrical signal. For this purpose the thermal radiation sensor is connected to an evaluation unit which samples and evaluates the electrical signal from the thermal radiation sensor. So the evaluation unit can detect the signals of the thermal radiation sensor sufficiently completely, the thermal radiation sensor is sampled at a sampling frequency that is greater than the rotational speed of the rotor multiplied by the number of bars. It is preferably at least twice the size. This ensures that the evaluation unit fully detects the detected thermal values of the respective bars. The detected values are preferably converted into digital data by means of the evaluation unit, so they can be made available for digital processing. This can be integrated in the evaluation unit. The detected values of the thermal radiation sensor can be output as desired, by way of example displayed or printed. The values may also be graphically processed, so a graphic display or depiction may be achieved. For this purpose the evaluation unit can have a communication link with a computer or comprise such a computer. The detected values can also be supplied to a complex monitoring and control unit which is used for status monitoring or error diagnosis of the system.

The method of the invention can be carried out during normal operation of the rotating electrical machine or thereafter, preferably on an electrical machine at operating temperature. The rotor for example can therefore be tested during normal operation. The rotor can also be tested directly after switching off the rotating electrical machine, for which purpose the rotation during petering out of the rotor is used. The current rotational speed of the rotor can be ascertained using the bars detected by means of the thermal radiation sensor. Of course, after the machine has been switched off the rotor can be decelerated to the extent that the condition in relation to the limit frequency is maintained.

Furthermore, it may also be provided that the rotor is driven externally in the event of disruption or once normal operation has ended. For this purpose the rotor can be connected by way of example to a motor which puts the rotor into a predefinable rotation. This enables parameters that are relevant to the rotor to be detected, even shortly after the end of normal operation, in order to be able to carry out the rotor testing.

A further embodiment of the invention provides that at least two thermal radiation sensors that are spaced apart in the circumferential direction are used. The two thermal radiation sensors can be arranged in the same position in the axial direction. They may be offset by way of example in the circumferential direction by 180°. Furthermore, there is the possibility of arranging the thermal radiation sensors axially offset from each other. In this embodiment they may also be arranged at the same angle to each other in the circumferential direction. This enables the circumference of the rotor to be thermally detected at different axial positions. Of course it may also be provided that the detected thermal radiation values of the thermal radiation sensors are evaluated jointly to obtain a detailed temperature profile of the rotor or to shorten testing timewise.

According to a further embodiment of the invention the rotor or a part of the rotor, such as a bar, can be coated with a coating that improves thermal radiation. The accuracy of detection can be improved hereby and lower quality thermal radiation sensors can be used.

It has proven particularly advantageous if the thermal radiation sensor is arranged in an axial region of the electrical machine in which some or all bars of the winding are contacted. In this way it is possible to monitor the contact points of the bars with each other or with a short-circuit ring or the like and to be alerted to disruptions in good time. During thermal stress it is precisely the connection points that are simultaneously exposed to mechanical stress as well, and these are of particular importance in relation to reliability. The invention therefore enables additional information to be obtained for testing.

The thermal radiation sensor itself can be designed as a thermopile. A suitable thermopile can be integrated by way of example in a sensor which has a cross-sectional area of about 4 mm². The thermopile can therefore have by way of example a reference layer and an absorption layer, between which a chip, forming the actual thermopile, is arranged. The chip can have by way of example an edge length of 0.1 mm×0.1 mm. In addition, the thermopile can have additional optical diffraction means, such as lenses, prisms or the like.

The thermal radiation sensor is preferably arranged at a spacing of 2 mm to 150 mm from the rotor. Of course a different distance may also be provided according to the construction of the rotating electrical machine. The thermal resolution of the thermal radiation sensor is preferably about 1 K. Reliable detection of individual bars of the rotor is achieved hereby.

The sample rate can be chosen by way of example in a range from 500 Hz to 2 kHz. Different sample rates are also possible depending on the thermal radiation sensor, therefore when using photodiodes by way of example, such as germanium photodiodes, gallium arsenide photodiodes, silicon photodiodes or the like.

It has proven particularly advantageous if the evaluation of the sampled values of the thermal radiation sensor includes a comparison with reference values. In this way it is possible to detect changes, in particular ageing phenomena on the rotor and optionally initiate countermeasures. It is precisely in large, expensive machines or in machines in which particular safety requirements or particular availability requirements need to be observed that the reliability as a whole can be significantly improved. A further aim of the invention results from this, namely the recognition of defective solder/weld joints, in particular between rotor bar and short-circuit ring in an asynchronous machine, and the recognition of local limit loads of individual bars or regions in the rotor that may possibly occur. If, by way of example, the electrical resistance changes at a defective connection point, this leads to an unbalanced current distribution in the rotor.

The invention also proposes a device for testing a bar winding of a rotor of a rotating electrical machine, having a thermal radiation sensor, which is arranged in a stator of the rotating electrical machine, by means of which thermal radiation of the rotor can be detected, wherein the thermal radiation sensor is designed to detect the thermal radiation of individual bars of the bar winding, wherein the rotor can be rotated at a speed that is lower than a predefined limit frequency of the thermal radiation sensor divided by the number of bars of the bar winding, and the thermal radiation sensor can be sampled by means of an evaluation device at a sampling frequency that is greater than the rotational speed of the rotor multiplied by the number of bars, and evaluated.

The device is used in particular for carrying out the inventive method.

A local temperature can be dynamically and contactlessly detected by way of the invention. Locally varying electrical resistances, in particular in the case of dynamic operating instances, such as start-up, blockages, change in rotational speed, change in load or the like, result in locally different temperatures which could not previously be ascertained in the prior art. The desired testing may be carried out by arranging one or more thermal radiation sensor(s), by way of example in the form of slot nut thermopiles, in the stator. The thermal radiation sensors are preferably arranged close to a transition between a short-circuit ring and a bar end or even in the region of the core of the rotor.

The evaluation of the measured thermal radiation values, by way of example of the rotor core or the rotor slots, allows a measure of temperatures prevailing at the measuring point, by way of example at the ends of the cage of the rotor bar, to be ascertained. With knowledge of the load state or different bar excessive temperatures, differences from normal operating behavior can be discerned herefrom compared to neighboring bars. Although the surface of the core is already at a high temperature level the temperature of each rotor bar can be accurately measured since the associated level of heat emission caused by the slot geometry is high per se.

The invention uses thermopiles in particular for the detection of local differences in a mean temperature of the rotor for the detection of unbalances in the rotor current system caused by way of example by losses of contact or casting defects and thermal overloading of individual contact points.

Overall, the following advantages result from the invention:

direct measurement of the temperature of individual rotor bars or regions in the short-circuit ring or transitions between bar and short-circuit ring, measurement of the thermal stress on individual bar-short-circuit ring contact points.

early detection of unbalances in the rotor during normal operation, substantially no modification of the rotor required, avoidance of the testing of stator currents, expansion of the admissible operating range and an increase in the thermal utilization of the rotating electrical machine optionally through to thermally critical point, and verification of constructional changes to thermomechanically highly stressed locations promptly and with little effort.

BRIEF DESCRIPTION OF THE DRAWING

Further advantages and features can be found in the following description of an exemplary embodiment. The exemplary embodiment serves solely to explain the invention and does not limit it.

In the drawings.

DETAILED DESCRIPTION OF PREFERRED EMBODIMENTS

Figure 1:
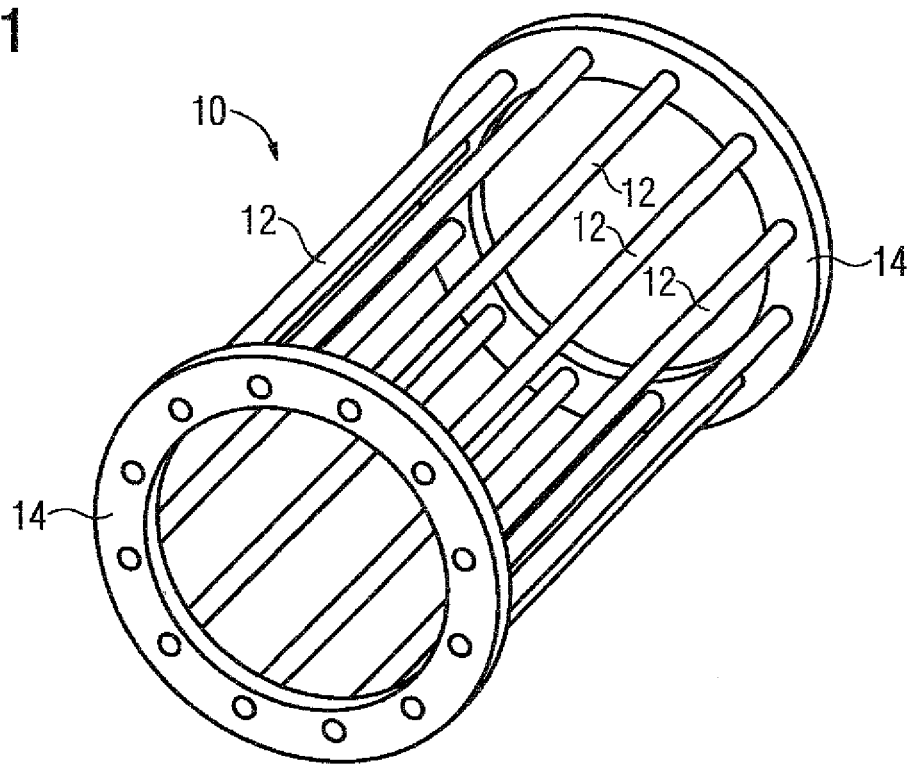
FIG. 1 shows in a schematic perspective view a rotor cage of an asynchronous machine without core.

FIG. 1 shows in a perspective schematic view a rotor cage 10 of a rotor 20 of an asynchronous machine without core, with the rotor cage 10 having bars 12 which are each electroconductively connected at the ends to a short-circuit ring 14. In the present case both the bars 12 and the short-circuit ring 14 are formed from a copper alloy and the bars 12 soldered, welded or cast at the ends to the short-circuit ring 14. From the schematic side view of the rotor cage 10 in FIG. 2 it can be seen that at the ends the individual bars 12 penetrate slightly through the respective short-circuit ring 14.

Figure 2:
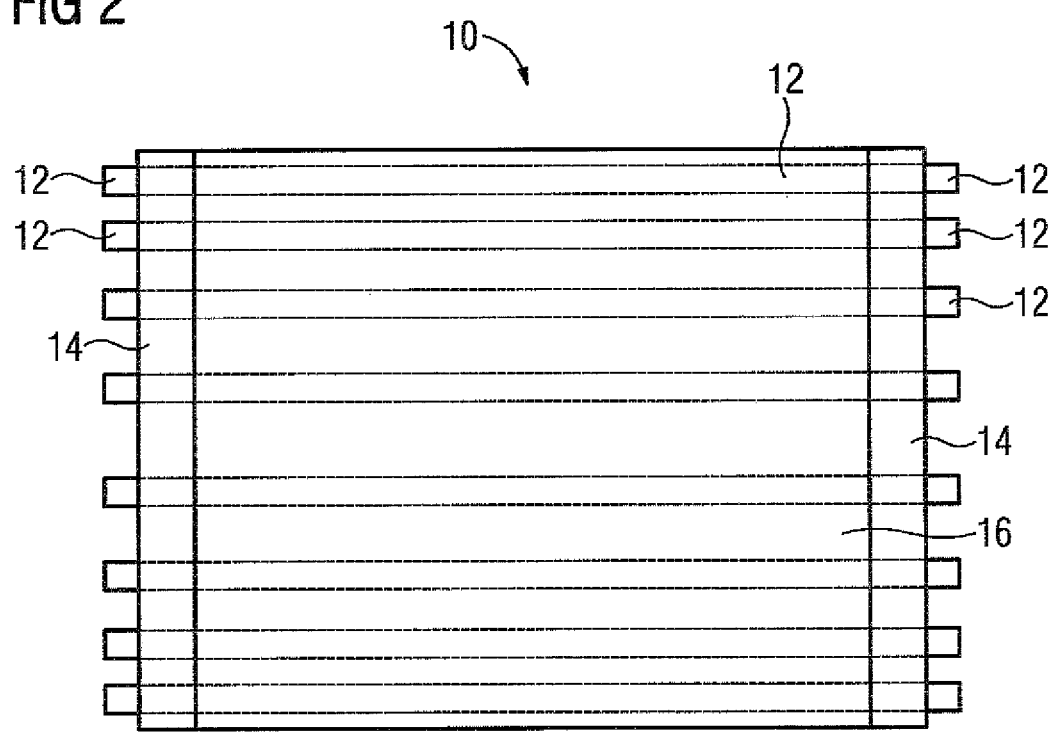
FIG. 2 shows a rotor cage according to FIG. 1 in a schematic side view with core.

In addition to the rotor cage 10 FIG. 2 shows the core 16 which is made from insulated electrical sheets which are stacked to form the core 16. The core 16 does not have designated slots in which the bars 12 are arranged.

If the rotor constructed in this way is thermally stressed, the bars 12 expand in a different ways in relation to the core 16 and to the short-circuit ring 14. This results in a thermal stress inside the rotor 10. The free bar ends are also stressed since they are held in the core on one side but the short-circuit ring expands radially.

Figure 3:
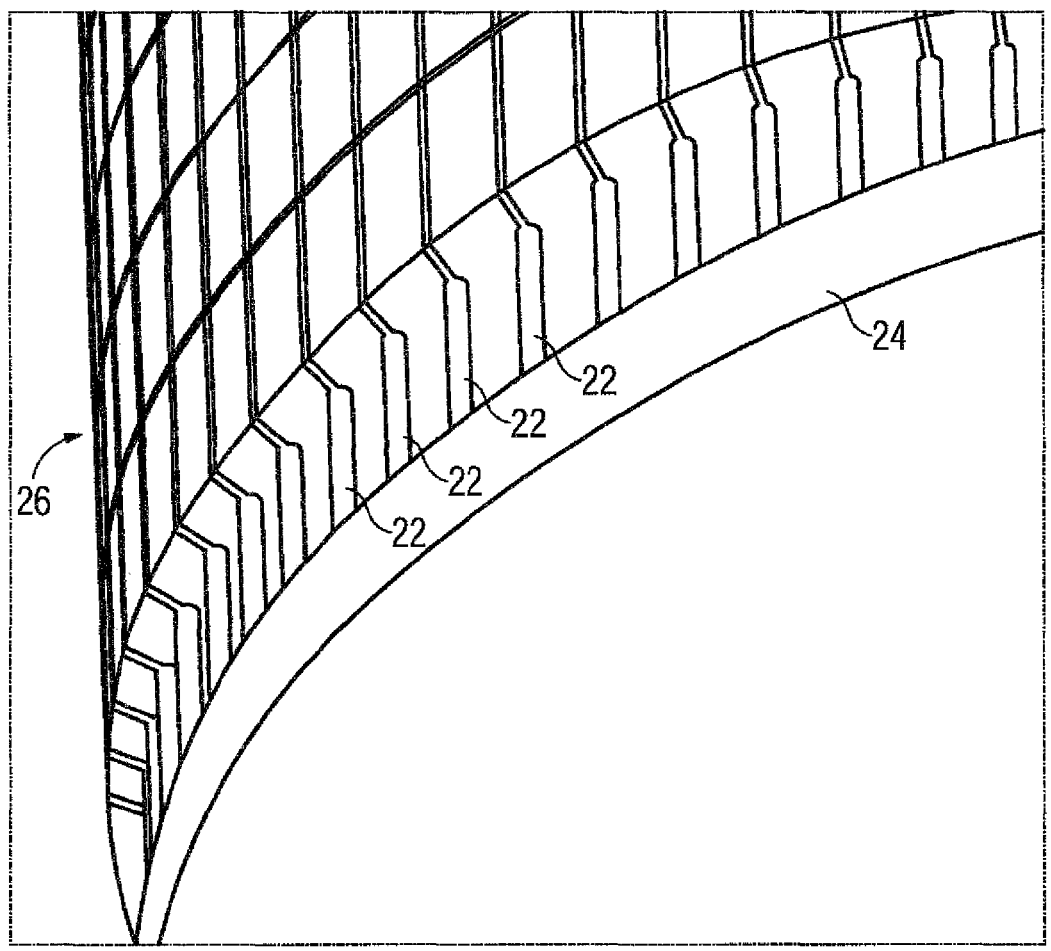
FIG. 3 shows a perspective view of a detail of a rotor on which testing is to be performed according to the invention.

FIG. 3 shows a detail of a rotor 20 of a three-phase asynchronous machine 30 in the disassembled state in a photographic view. The rotor 20 has a core 26 which comprises slots (not denoted) into which bars 22 are introduced. At the end the bars 22 are welded to a short-circuit ring 24. The construction of the rotor according to FIG. 3 therefore substantially matches that of the rotor shown in FIG. 2.

Figure 4:
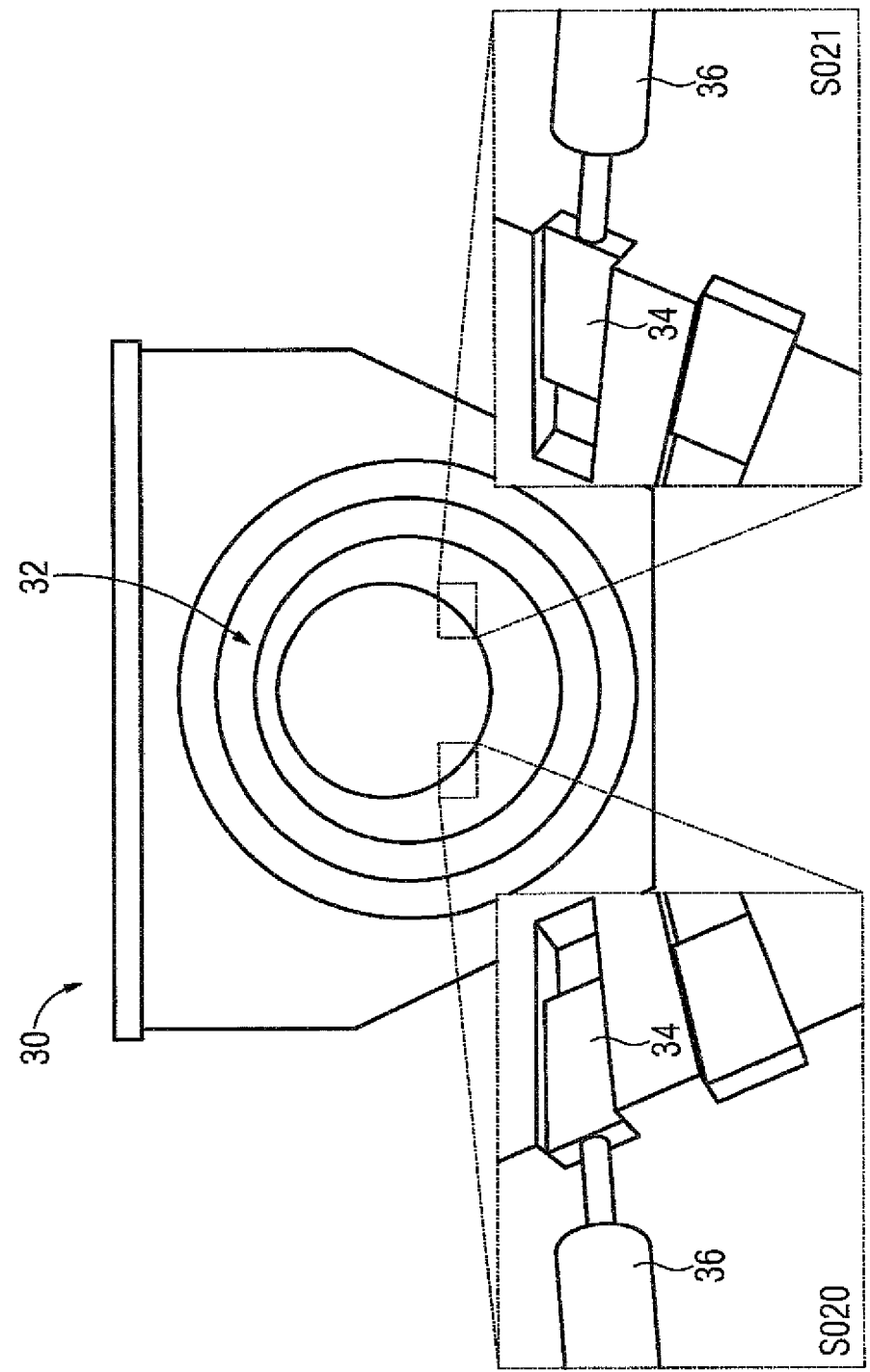
FIG. 4 shows a schematic perspective view with enlarged detailed areas of a stator of a rotating electrical machine in which the rotor according to FIG. 3 is used during normal operation.

FIG. 4 shows an electrical machine 30 with a stator 32 in which the rotor 22 according to FIG. 3 is arranged so as to rotate during normal operation. From two detailed views in FIG. 4 it can be seen how the thermal radiation sensors, which are designed here as thermopiles 34, are arranged in the slots of the stator 32. The thermopiles 34 are designed as slot nuts and are connected by electrical cables 36 to an evaluation unit (not shown).

The following graphs in FIGS. 5-8 refer to the electrical machine 30 according to FIG. 4 with the rotor according to FIG. 3. The arrangement of the thermopiles 34 according to FIG. 4 is an embodiment according to this exemplary embodiment. If required, the thermopiles 34 can of course be arranged at other suitable positions on the circumference of the stator 32 and at suitable axial positions.

Figure 5:
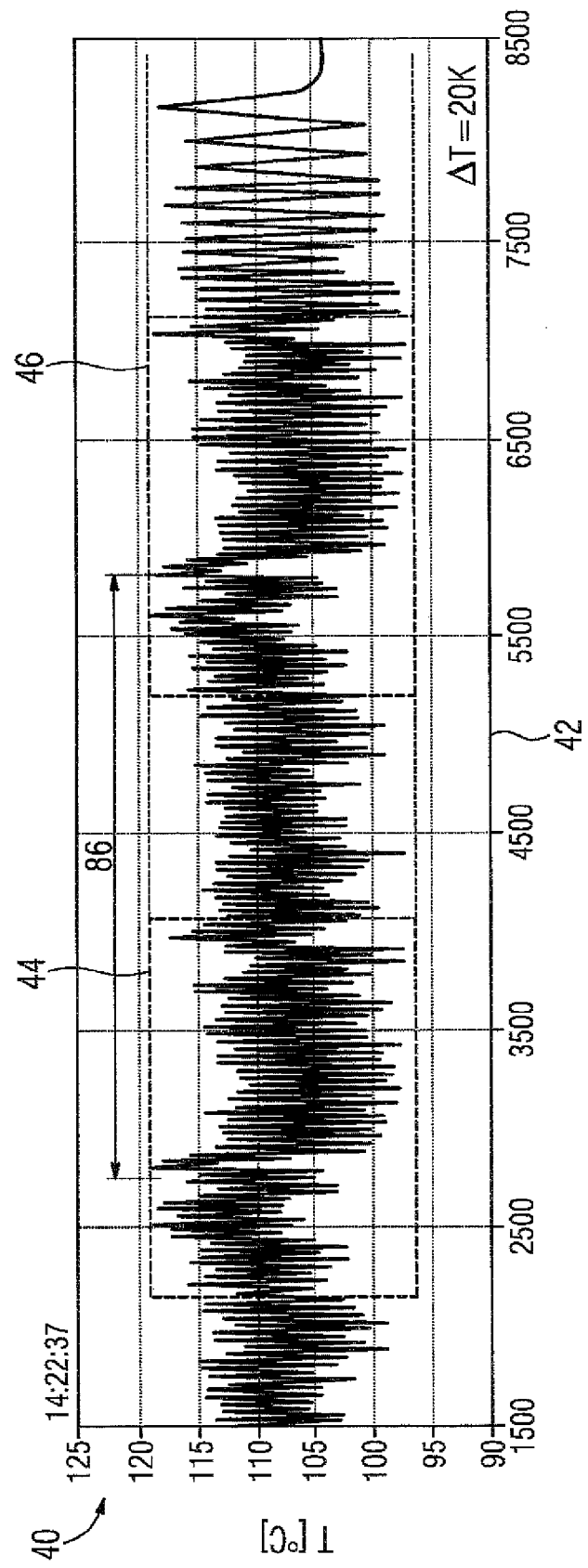
FIG. 5 shows a temperature sample graph in which the sampled temperature values detected by means of a thermopile are shown by means of a graph.

In the graph according to FIG. 5 the temperature in degrees Celsius is plotted on the ordinate. The sample times are plotted on the abscissa. The sample rate in the present case is about 500 Hz. In the measurement according to FIG. 5 the rotor rotates at a speed of 10 per min. Recurring signatures at an interval of 86 periods can be seen in the rotor temperature. The number of periods can be attributed to the rotor slot number of the electrical machine 30 and is therefore also 86. In the graph according to FIG. 5 regions 44 and 46 are shown which demonstrate recurrent signatures in the temperature profile. It can be seen therefrom that the two illustrated signatures 44, 46 can be associated with successive revolutions.

Figure 6:
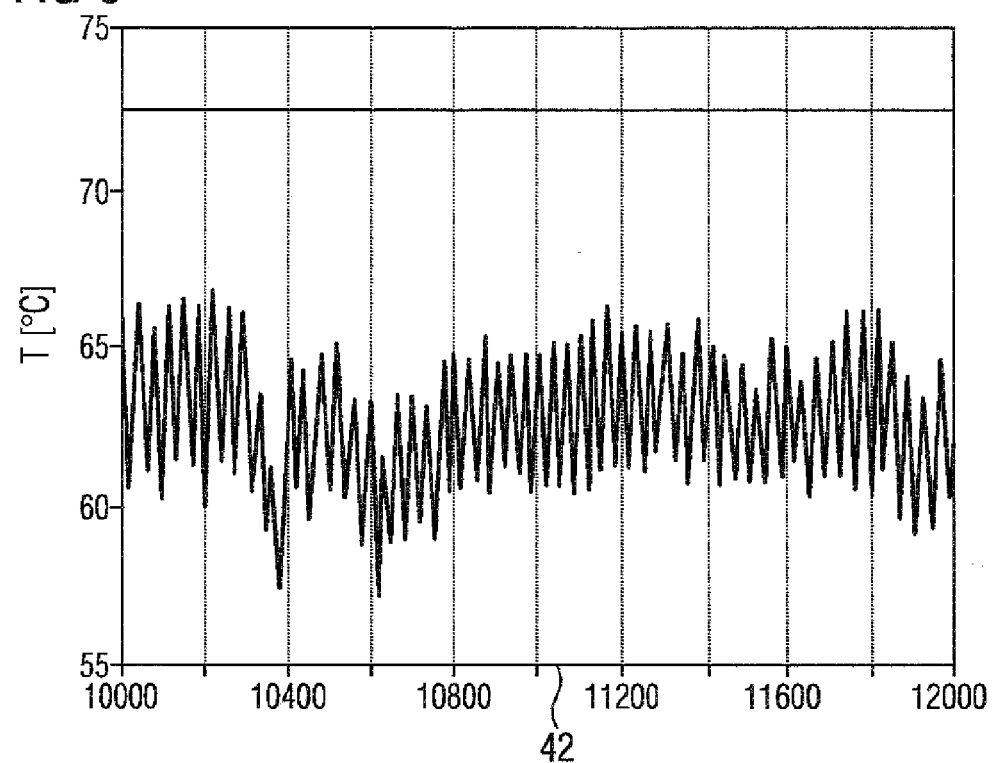
FIGS. 6-8 show graphs of measurement results as in FIG. 5 but at different rotational speeds of the rotor.
Figure 7:
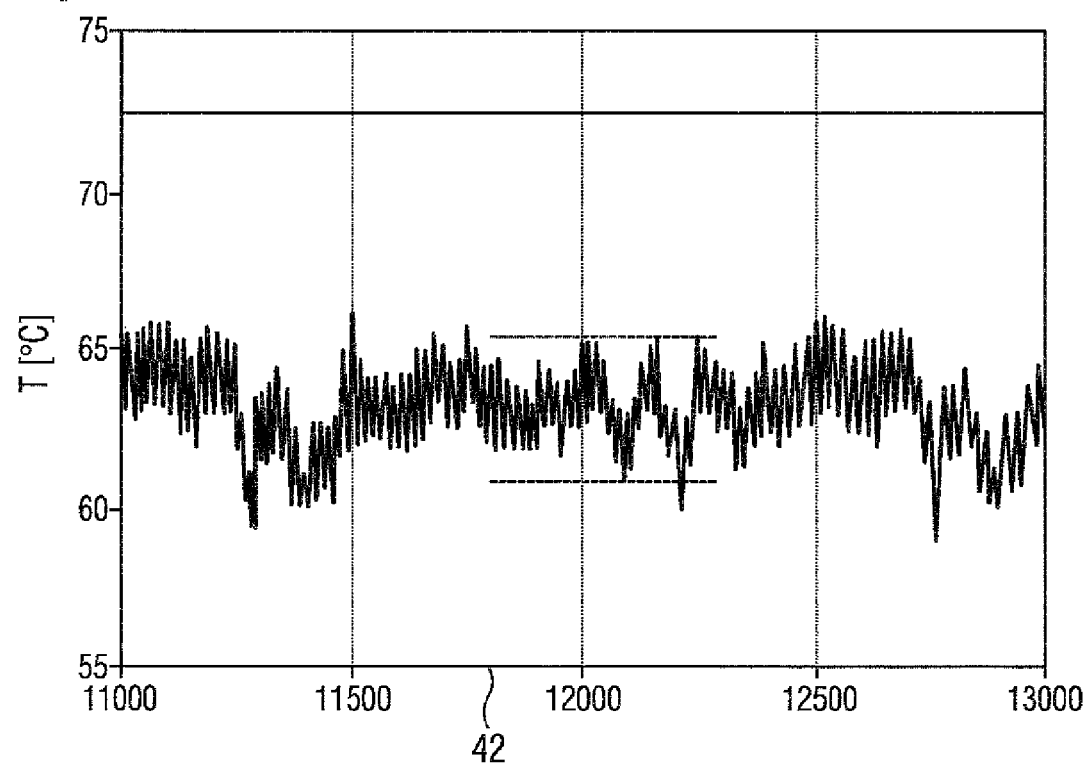
Figure 8:
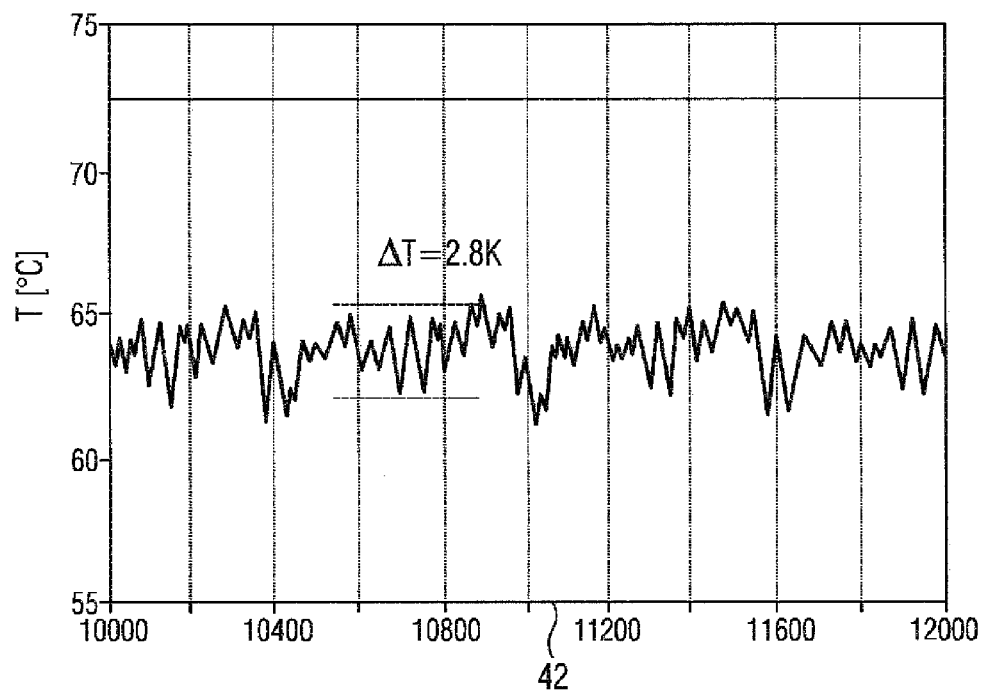

FIGS. 6-8 relate to an external drive of the rotor 20, i.e. the electrical machine 30 is not active. The axes are assigned in accordance with FIG. 5. FIG. 6 shows a view at a rotor speed of 10 revolutions per minute, whereas FIG. 7 relates to a rotor speed of 20 revolutions per minute and FIG. 8 to a rotor speed of 50 revolutions per minute. The other parameters are the same for all three figures. It can be seen from FIGS. 6-8 how the rotor speed affects the measuring result. As the bar-related rotor speed approaches the limit frequency of the thermopile 34, the measuring accuracy of the local rotor temperature decreases.

What is claimed is:

1. A method for testing a bar winding of a rotor of a rotating electrical machine, comprising:

rotating the rotor at a speed that is lower than a predefined limit frequency of a thermal radiation sensor divided by the number of individual bars of the bar winding;

detecting a thermal radiation of individual bars of the bar winding of the rotor by the thermal radiation sensor arranged in a stator of the electrical machine to thereby enable a determination of a thermal radiation of the rotor;

generating sampled values in response to the determined thermal radiation of the rotor by sampling the thermal radiation sensor at a sampling frequency that is higher than a rotational speed of the rotor multiplied by the number of individual bars; and evaluating the sampled values of the thermal radiation sensor.

2. The method of claim 1, carried out during normal operation of the rotating electrical machine or thereafter.

3. The method of claim 1, further comprising driving the rotor externally in the event of disruption or once normal operation has ended.

4. The method of claim 1, further comprising using at least two of said thermal radiation sensor disposed in circumferential spaced apart relationship.

5. The method of claim 1, further comprising coating the rotor with a coating to improve thermal radiation.

6. The method of claim 1, wherein the thermal radiation sensor is arranged in an axial region of the electrical machine, in which some or all individual bars of the bar winding are in contact.

7. The method of claim 1, wherein the thermal radiation sensor is a thermopile.

8. The method of claim 1, further comprising comparing the sampled values of the thermal radiation sensor with reference values.

9. A device for testing a bar winding of a rotor of a rotating electrical machine, said device comprising:

a thermal radiation sensor arranged in a stator of the rotating electrical machine and configured to detect a thermal radiation of individual bars of the bar winding of the rotor, as the rotor rotates at a speed that is lower than a predefined limit frequency of the thermal radiation sensor divided by the number of individual bars of the bar winding, to thereby enable a determination of a thermal radiation of the rotor; and an evaluation device configured to generate sampled values in response to the determined thermal radiation of the rotor by sampling the thermal radiation sensor at a sampling frequency that is greater than a rotational speed of the rotor multiplied by the number of individual bars to produce sample values, and configured to evaluate the sample values.

10. The device of claim 9, further comprising at least two of said thermal radiation sensor disposed in circumferential spaced apart relationship.

11. The device of claim 9, further comprising a coating for application on the rotor to improve thermal radiation.

12. The device of claim 9, wherein the thermal radiation sensor is arranged in an axial region of the electrical machine, some or all of the individual bars of the bar winding being contacted in the axial region.

13. The device of claim 9, wherein the thermal radiation sensor is a thermopile.

14. The device of claim 9, wherein the evaluation device is configured to compare the sampled values of the thermal radiation sensor with reference values.

* * * * *